United States Patent [19]
Honda et al.

[11] Patent Number: 5,900,619
[45] Date of Patent: * May 4, 1999

[54] OPTICAL DEVICE COMPRISING A PHOTODETECTOR FOR DETECTING LIGHT SCATTERED OUTSIDE A DIFFRACTION LIMIT OF AN OBJECTIVE LENS

[75] Inventors: Kazuo Honda; Chiaki Kojima, both of Kanagawa, Japan

[73] Assignee: Sony Corporation, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/681,480

[22] Filed: Jul. 23, 1996

[30] Foreign Application Priority Data

Jul. 26, 1995 [JP] Japan .................................. 7-190722

[51] Int. Cl.⁶ .............................. G11B 7/135; H01S 3/18; H01L 31/12
[52] U.S. Cl. ...................... 250/201.5; 250/216; 235/462; 369/121; 372/43
[58] Field of Search ................................ 250/214.1, 216, 250/201.5, 214 LS; 257/431, 432, 80, 82, 84, 85, 98; 372/50, 99, 101, 102, 106, 43; 369/121, 122, 109, 110; 235/454, 462, 464, 472

[56] References Cited

U.S. PATENT DOCUMENTS

| | | | |
|---|---|---|---|
| 5,122,653 | 6/1992 | Ohki ........................................ 250/216 |
| 5,180,909 | 1/1993 | Ohyama et al. ......................... 250/216 |
| 5,200,605 | 4/1993 | Satoh et al. ........................... 250/214.1 |
| 5,233,595 | 8/1993 | Kawakubo ............................... 369/116 |
| 5,298,735 | 3/1994 | Peterson et al. ...................... 250/214.1 |
| 5,319,725 | 6/1994 | Buchmann et al. ....................... 385/14 |
| 5,349,210 | 9/1994 | Ackley et al. ............................. 257/84 |
| 5,352,919 | 10/1994 | Takano .................................... 257/431 |
| 5,426,626 | 6/1995 | Katayama ............................. 369/44.41 |
| 5,606,572 | 2/1997 | Swirhun et al. .......................... 372/96 |
| 5,608,233 | 3/1997 | Sahara et al. ............................. 257/80 |
| 5,625,613 | 4/1997 | Kato et al. ............................... 369/112 |

*Primary Examiner*—Edward P. Westin
*Assistant Examiner*—John R. Lee
*Attorney, Agent, or Firm*—Rader, Fishman & Grauer; Ronald P. Kananen

[57] ABSTRACT

For the sake of reducing the number of parts and simplifying adjustment for the optical positions of the parts in an optical device wherein information signals from the light scattered or diffracted which is derived from an optical recording medium are detected, there is provided the optical device of the invention comprising a semiconductor substrate provided with a plane light emitting laser element and a photodiode; and an optical system; a layout position of the photodiode being selected in a region which extends out of the confocal region of the optical system, and from which the light scattered or diffracted from a section irradiated with laser light irradiation derived from the plane light emitting laser element with respect to the section to be irradiated.

15 Claims, 6 Drawing Sheets

OPTICAL DEVICE COMPRISING A PHOTODETECTOR FOR DETECTING LIGHT SCATTERED OUTSIDE A DIFFRACTION LIMIT OF AN OBJECTIVE LENS

The present invention relates to an optical device being suitably applied for e.g., a bar code reader, an optical pickup in optical record reproducing machines or the light.

In conventional optical devices, for example, a bar code reader (BCR), since respective optical parts are independently assembled, a structure of the whole device becomes complicated and large-sized. Besides a strict precision in alignment is required for setting optical layout of these optical parts.

FIG. 1 is a constitutional view showing an example of the optical device constituting a conventional bar code reader comprising a He—Ne laser element 21; an optical system composed of a condenser lens, a beam splitter, and the like; a bar code reader B; a scanning mirror; and a photodiode section 24 containing a photodiode PD etc. and being disposed on an optical path separated from the optical system 22. These constitutional elements are arranged in a prescribed positional relationship with a good precision, thereby to compose the optical device.

Laser light L produced from the He—Ne laser element 21 is reflected by a scanning mirror 23 through the optical system 22 to scan the bar code B. The light irradiated on the bar code B is absorbed by black bars, respectively, while the light is reflected by white spaces, respectively, so that there arises return light. The return light is inputted again to the optical system 22 wherein the light is split by means of the beam splitter, and then the light splitted is subjected to signal detection by the photodiode section 24. An analog signal A matched with a pattern of the bar code thus detected is converted into a digital signal D, and the signal is decoded by a decoder (not shown).

In the optical device as described above, the He—Ne laser element employed as a light source is a large-sized, so that it is difficult to make the whole optical device small-sized, besides energy conversion efficiency from electricity to light is low in such optical device.

To eliminate these disadvantages, such an optical device having a structure therein a semiconductor laser is employed in place of the He—Ne laser element as a light source has been manufactured.

In the optical device of FIG. 1, however, even when a semiconductor laser is used as the light source, the number of parts for the optical system increases, besides a high precision is required for setting the layout of the respective parts.

In order to cope with the problem described above, the present applicants have proposed an optical device for bar code reader in our Japanese Patent Application No. 223839/1993 (U.S. patent application Ser. No. 416,733, now abandoned ) "Optical Device for Code Reader" wherein a light emitting element and a photodiode are fixed in hybrid manner on a single semiconductor substrate as shown in the constitutional view of FIG. 2.

The optical device shown in FIG. 2 is composed of a composite optical element for bar code reader 31, a lens for condensing light 32, and a swingable mirror 33.

The composite optical element 31 for bar code reader 31 contains a semiconductor chip 36 on a part of a plane of which is formed a photodiods PD, a sub-mount 36 is secured to a region out of that on which is formed the photodiode PD on the semiconductor chip 34, and a laser diode LD for outputting laser light L is fixed on the sub-mount 36, whereby a height of the laser diode LD has been adjusted.

A prism 41 having right triangle in section is fixed on the photodiode PD in such a state that the inclined surface 41a of the prism is directed to the laser diode, and on a part of the inclined surface 41a is disposed a reflecting film 42 being a mirror or a half mirror with respect to the laser light L, while all the laser light L inputted transmits through the part other than that covered with the reflecting film 42 on the inclined surface 41a.

In the constitution of this optical device, the laser light L outputted from the laser diode LD is reflected upwards by the reflecting film 42, the light reflected is condensed by the lens 32, and further reflected by the mirror 33 to be focused on the bar code B to be read. At that time, the mirror 33 is swung, whereby the laser light L scans the bar code B.

The laser light L reflected by the bar code B is further reflected by the mirror 33, and condensed with the lens 32 to input the same to the inclined surface 41a. The laser light L inputted to the part other than that covered with the reflecting film 42 in the inclined surface 41a transmits the same to be inputted to the photodiode PD.

In the above described optical device, the light emitting element fabricated from the laser diode LD secured on the sub-mount 36 and the photodiode fabricated from the photodiode PD are fixed on the single semiconductor chip 34, whereby a reduction in the number of optical parts as well as a simplification in alignment of the optical parts are intended.

Although the reduction in the number of the parts in the optical system and the simplification in alignment are intended in accordance with the optical device shown in FIG. 2, it is required in the optical device that the light emitting element and the prism are separately prepared from the semiconductor chip, and thereafter they are attached to the semiconductor chip. Accordingly, the alignment with respect to the layout for these parts are also required similarly as in conventional cases.

SUMMARY OF THE INVENTION in view of the aforesaid aspect, it is an object of the present Invention is to reduce the number of optical parts as well as to simplify the alignment in setting the optical layout for these optical parts in an optical device such as a bar code reader and the like, whereby simplification and miniaturization of the whole device are intended, besides such optical device can easily be manufactured.

Another object of the present invention is to receive scatter light or diffracted light containing readout information from an optical recording medium onto which has been recorded prescribed information such as bar code and the like to detect the information signal.

The above described objects are achieved by providing the optical device according to the first invention of this application which comprises a semiconductor substrate provided with a plane light emitting laser element and a photodiode; and an optical system; a layout position of the photodiode being selected in a region which extends out of the confocal region of the optical system, and from which the light scattered or diffracted from a section irradiated with laser light irradiation derived from the plane light emitting laser element with respect to the section to be irradiated.

According to the constitution of the above-mentioned present invention, since a layout position of the photodiode is selected in a region which extends out of the confocal region of the optical system, and from which the light scattered or diffracted from a section irradiated with laser light irradiation derived from the plane light emitting laser element with respect to the section to be irradiated, information signals which are transmitted from the section to be irradiated and contained in the scatter or diffracted light can be detected.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

In the present invention the optical device having a confocal optical system which has been proposed by the invention of "Optical Device" according to Japanese Patent Application No. 210691/1993 (U.S. patent application Ser. No. 294307, now abandoned) which had been filed by the present applicants is constituted. The confocal optical system is the one wherein a light emitting element and a photodiode are formed monolithically on a single semiconductor substrate, so that both of an optical recording medium and a radiant for laser light derived from the light emitting element are positioned at the confocal point with respect to a converging lens.

An embodiment of the optical device according to the present invention will be described hereinbelow.

Figure 1:
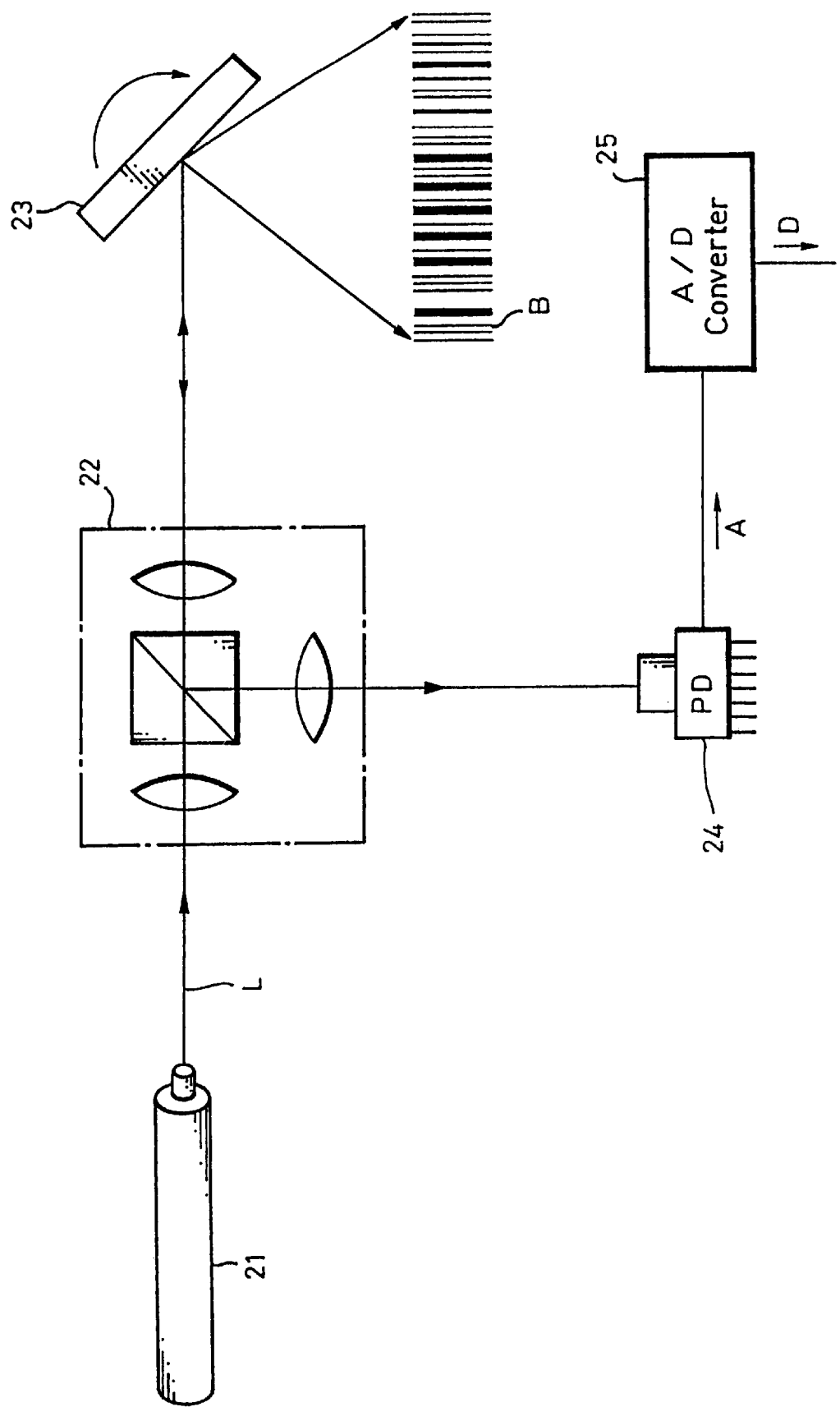
FIG 1 is a schematic view showing an example of an optical device constituting a conventional bar code reader.
Figure 2:
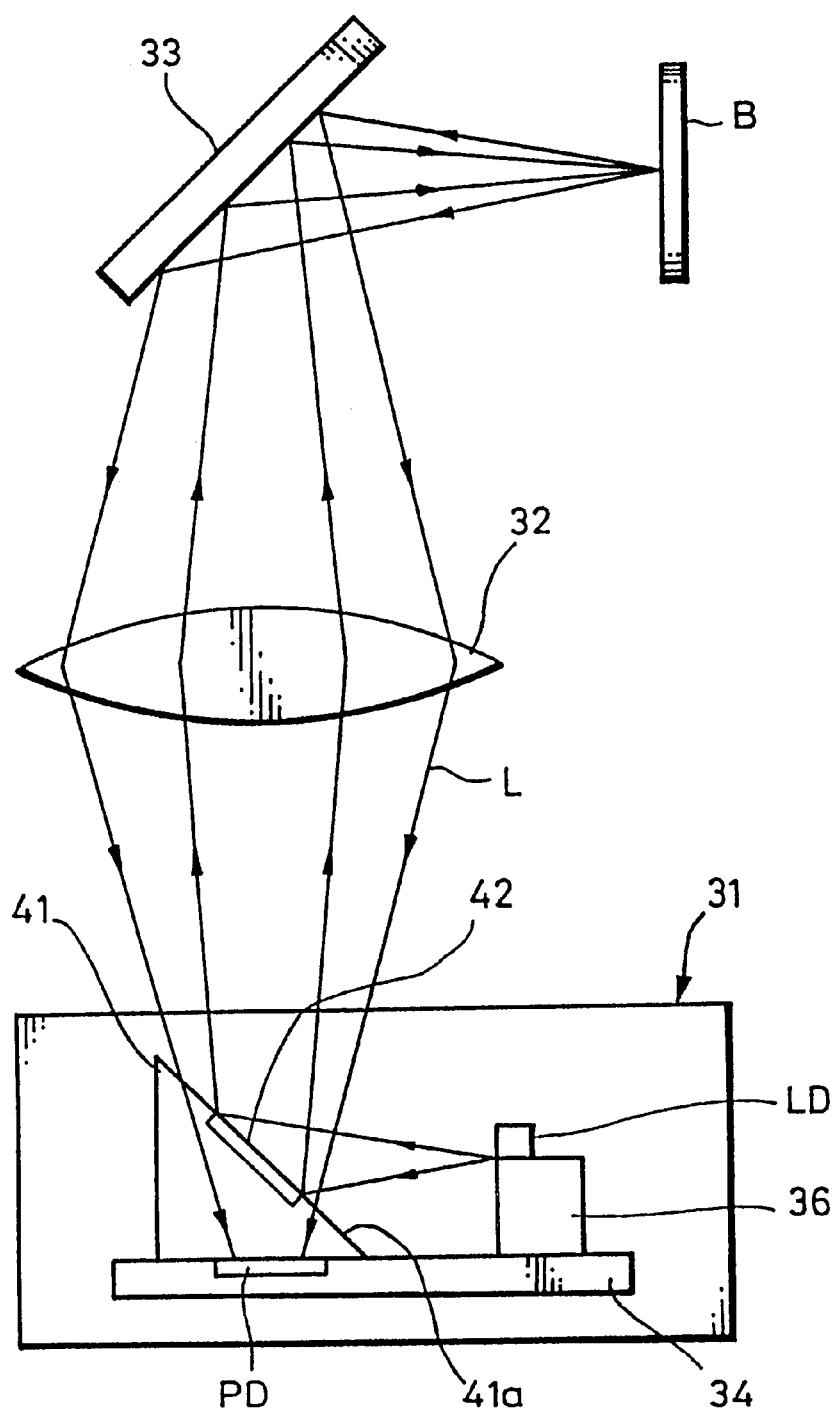
FIG. 2 is a schematic view showing an optical device.
Figure 3:
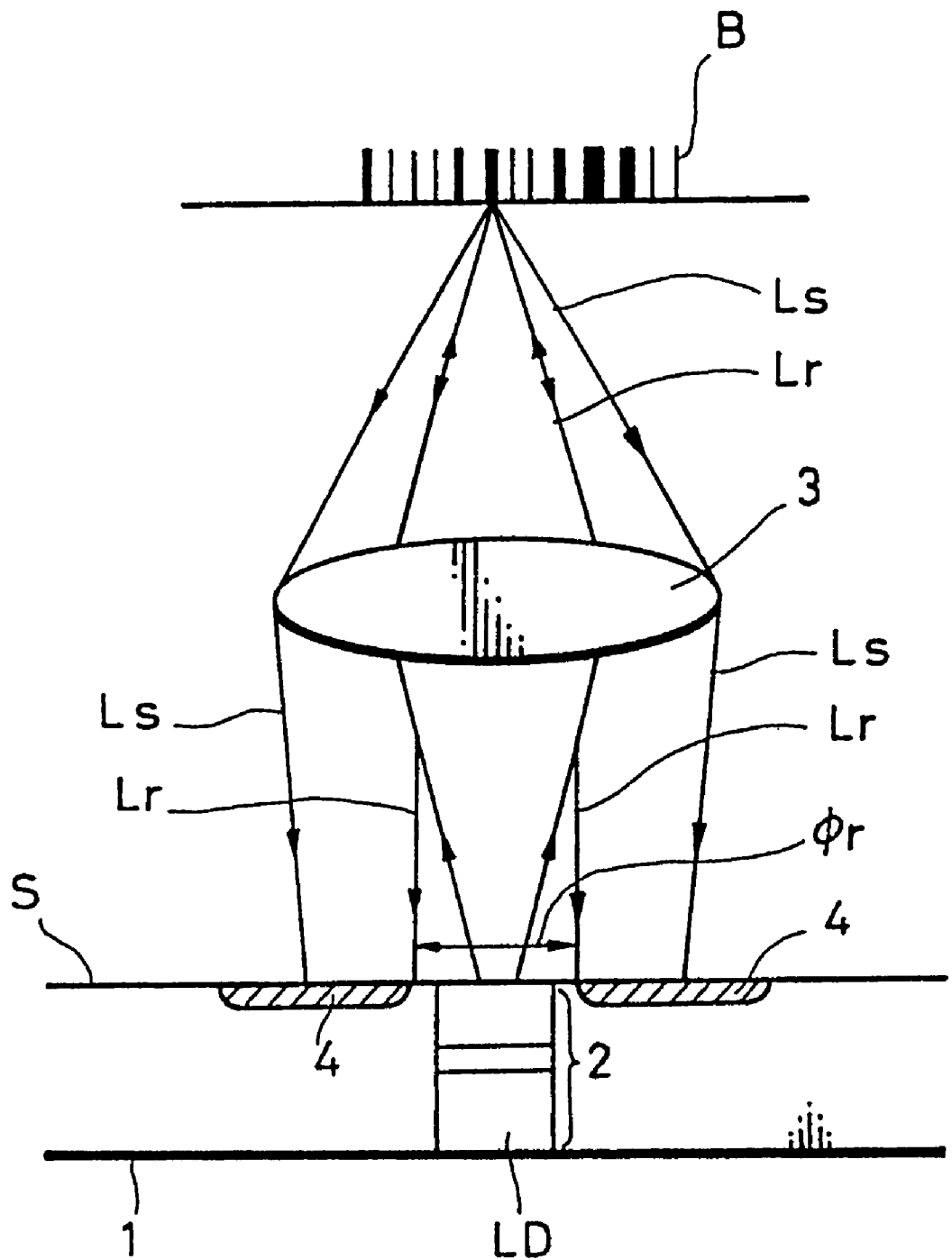
FIG. 3 is a constitutional view showing an embodiment of the optical device according to the present invention.

FIG. 3 is a schematic view showing an embodiment of the optical device according to the present invention wherein a light emitting element 2 being a plane light emitting laser element LD derived from a semiconductor laser of a vertical resonator type and an objective lens 3 are disposed on a semiconductor substrate 1 made of, for example, GaAs, and constitutions and positional relationships for these constituents are determined, respectively, in such that the plane light emitting laser element LD and a section to be irradiated, i.e., the plane of a bar code B as an optical recording medium are positioned at the confocal point with respect to the objective lens 3.

Furthermore, a photodiode 4 composed of a photodiode or the like is located and formed in a region out of the confocal region, which will be described hereunder, on the plane containing the confocal position S of the semiconductor substrate 1. In other words, the plane light emitting laser element and the photodiode are formed monolithically on a single semiconductor substrate with a prescribed positional relationship.

The laser light L radiated from the light emitting element 2 is converged by the objective lens 3 to be irradiated on the surface of bar code B.

Due to the laser light irradiation, reflected light Lr and scattered-diffracted light Ls are produced from the surface of bar code B.

The reflected light Lr in the above described types of light returns on the same optical path as that at the time of going, and converged by the objective lens 3 within a limit of diffraction Φr. When a numerical aperture of the objective lens 3 and a wavelength of the laser light L represented by N.A. and λ (nm), respectively, the limit of diffraction Φr is positioned at a point which is apart from the optical axis by a distance (nm) of 1.22 λ/N.A. Thus, the reflected light Lr is irradiated within a region containing the light emitting element 2 on the plane of confocal position S, i.e., a confocal region.

On the other hand, the scattered or diffracted light Ls is inputted to the objective lens 3 through the path out of the optical path through which the reflected light Lr passes, and irradiated to the area out of the above-mentioned limit of diffraction, i.e., the region out of the confocal region in the plane of confocal position S.

Accordingly, when the photodiode 4 is located in the region out of the confocal region, the scattered-diffracted light Ls can be received to detect signals contained therein.

Pattern signals of the bar code B, i.e., information signals are mainly contained in the above-mentioned scattered-diffracted light Ls. Thus, the photodiode 4 is located as mentioned above, and the scattered-diffracted light Ls is received to detect the signals contained therein, whereby the pattern signals of the bar code B can be detected.

The pattern signals thus detected are subjected to analog/digital conversion as in the above-mentioned example of the prior art, thereby reading the signals.

Figure 4A:
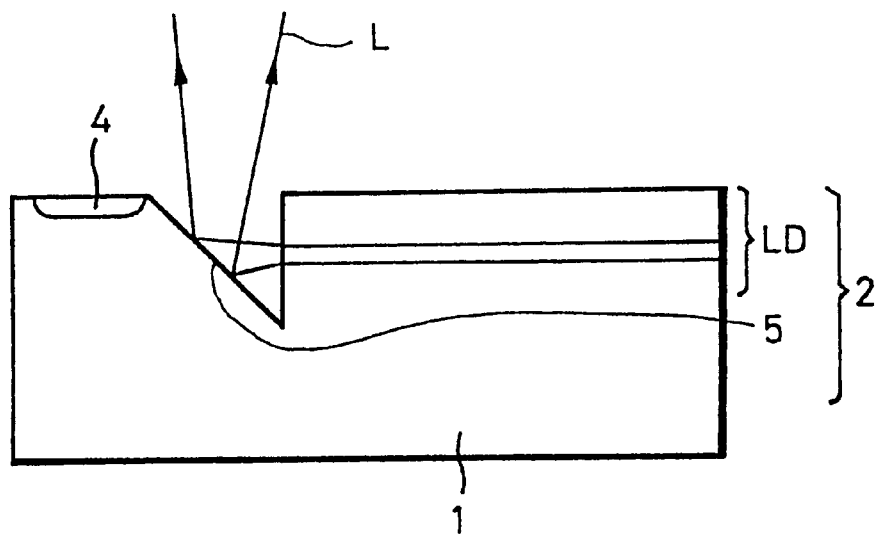
FIG. 4A is a schematic constitutional view showing another embodiment of the optical device according to the present invention.
Figure 4B:
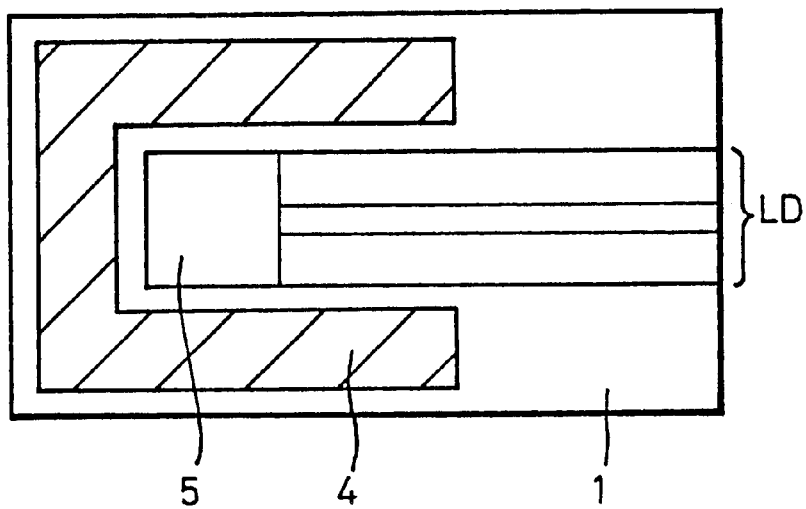
FIG. 4B is a plan view showing the optical device of FIG. 4A.

In the aforementioned embodiment, while the light emitting element 2 has seen prepared from the semiconductor laser LD of a vertical resonator type, the light emitting element 2 may be composed of a semiconductor laser LD of a horizontal resonator type and a reflecting mirror 5 which reflects light outputted towards the vertical direction from the horizontal direction as in the schematic constitutional view of FIG. 4A showing another embodiment of the optical device according to the present invention. In this case, a planar layout for the respective elements may be constituted in such that the periphery of the reflecting mirror 5 is enclosed by the photodiode 4 prepared from a photodiode or the like as shown, for example, in FIG. 4B being a plan view of FIG. 4A showing the optical device according to the present invention.

Figure 5A:
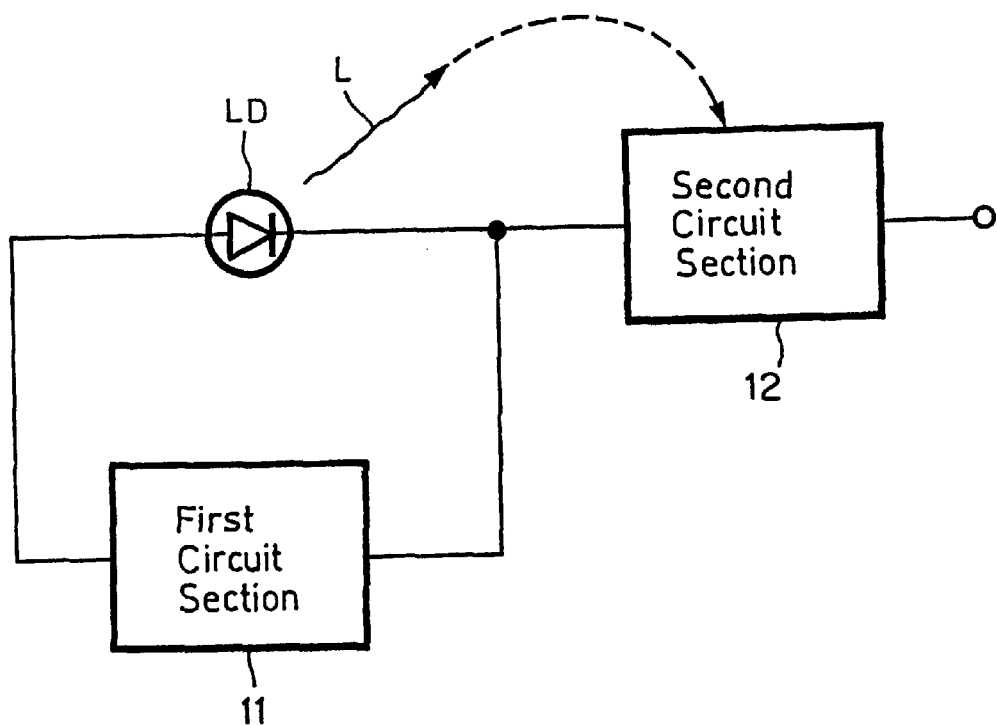
FIG. 5A is a block diagram showing peripheral circuits.

Furthermore, in the optical device according to the present invention, the light emitting element 2 and the photodiode 4 as well as a circuit constituting section containing these elements may be integrated. FIG. 5A is a block diagram wherein the circuit is composed of the light emitting element 2, i.e., semiconductor laser LD, a first circuit section 11, and a second circuit section 12.

The first circuit section 11 comprises the above-mentioned photodiode 4, and circuits relating thereto, for example, an amplifying circuit for amplifying detection signals from the photodiode 4, a signal processing circuit for the detection signals, and the like circuits. Moreover, the second circuit section 12 comprises a monitor photodiode such as a monitor photodiode which receives the laser light outputted from the side opposite to an end of outputting laser light L towards a section to be irradiated in the semiconductor laser LD constituting the light emitting element 2, and the circuits relating thereto, for example, an amplifying circuit for amplifying the detection signals from the monitor photodiode and the like circuits, whereby output of the semiconductor laser is controlled.

Figure 5B:
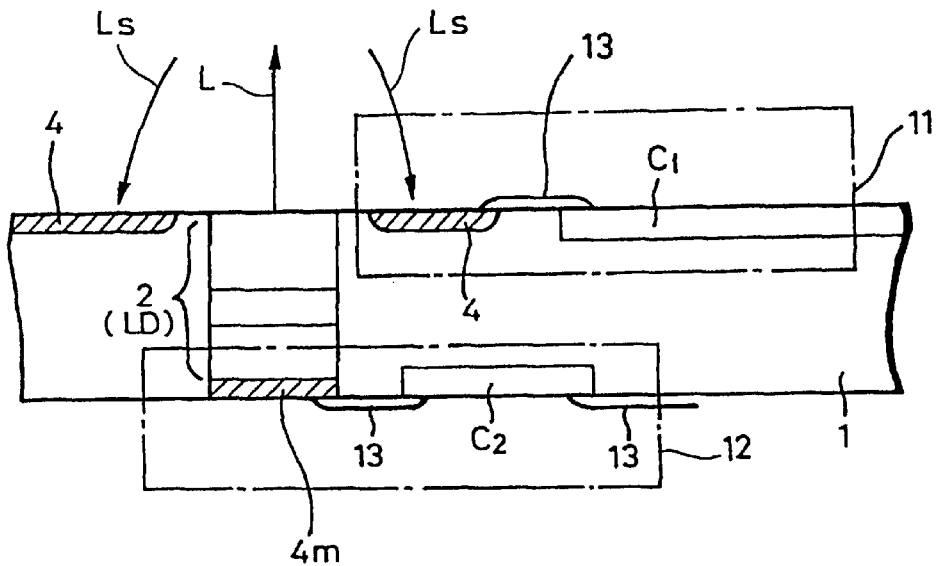
FIG. 5B is a constitutional view showing a layout for circuit elements of the peripheral circuits.

FIG. 5B is a schematic sectional view showing an embodiment of an optical device in which the circuit sections as described above are integrated. In this case, a plane light emitting laser element LD constituting the light emitting element 2 is located on the semiconductor substrate 1 in such that the plane light emitting laser element LD guides the aforementioned laser light from a main surface side of the semiconductor substrate 1, so that the above-mentioned first circuit section 11 is formed on the main surface side.

More specifically, the photodiode 4, i.e., a photodiode PD is formed simultaneously with an IC (integrated) circuit $C_1$ containing the aforementioned amplifying circuit, signal processing circuit, and the like circuits relating thereto. While on the opposite main surface side of the substrate 1, a monitor photodiode 4m for receiving the light outputted from the back of the laser element LD, and an IC circuit $C_2$ containing the above-mentioned amplifying circuit and the like circuits relating thereto are formed.

Although in the embodiments mentioned above, the invention has been described with respect to tho optical device used for bar code readers, it is not limited to the case where an optical recording medium which will be a section to be irradiated is a bar code, but also applicable for another optical device such as an optical pickup and the like in the case where the optical recording medium is an optical disk on which are formed concave and convex information pits or an optical magnetic disk from which information is read out by magnetooptical effect.

For instance, in case of detecting such pits, when the light diffracted by differences in levels of the pits is received by the photodiode 4, signals contained in the light can be detected.

Figure 6:
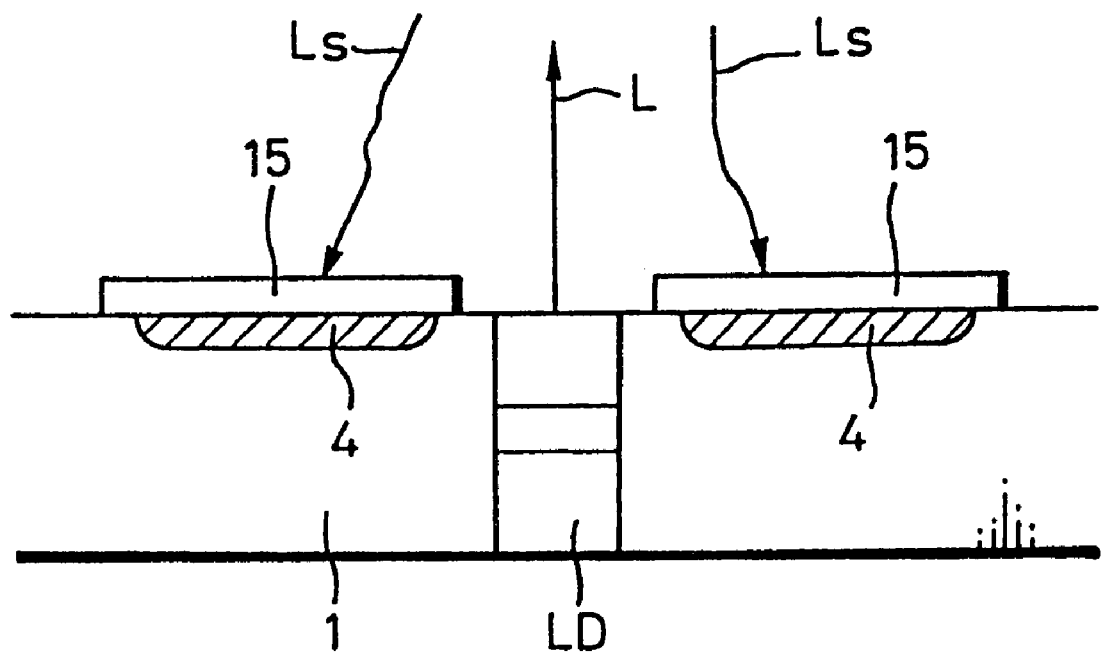
FIG. 6 is a constitutional view showing the essential part of still another embodiment of the optical device according to the present invention.

Detection by means of a magneto-optical effect, i.e., detection for the rotation of a polarizing angle due to Kerr effect is carried out in such a manner that an analyzer 15, being capable of separating polarized light, made from, for example, a wire grid or the like is disposed on the photodiode 4 as a means for separating polarized light, and the light (scattered-diffracted light) received by the analyzer 15 is subjected to polarized light-separation as in FIG. 6 showing a schematic section of the essential part of a still another embodiment of the optical device according to the present invention. Thus, magneto-optical signals can be detected, and in other words, information recorded can be read out.

According to the present invention mentioned above, the optical device comprises a plane light emitting laser element and a photodiode which are monolithically disposed on a single semiconductor substrate as well as an optical system, and further the photodiode being located in a region which is out of a confocal region of the optical system and where the light scattered or diffracted from a section to be irradiated is obtained. As a result, the optical device which receives the light scattered or diffracted to detect signals contained therein can be manufactured with a reduced number of parts and in easy alignment for the parts in their positions.

Therefore, it is possible to achieve miniaturization and integration of optical devices, besides the manufacturing cost therefor can be reduced.

Having described a preferred embodiments of the invention with reference to the accompanying drawings, it is to be understood that the invention is not limited to those precise embodiments and various changes and modifications could be affected therein by one skilled in the art without departing from the spirit or scope of the invention as defined in the appended claims.

What is claimed is:

1. An optical device for reading data stored on an optical storage medium comprising:
   a semiconductor substrate with a laser element and a photodetector formed thereon; and
   an optical system containing an objective lens positioned on an optical path of laser light irradiated from said laser element,
   wherein said photodetector receives laser light scattered from the section of said optical storage medium irradiated with the laser light, said photodetector detecting only the scattered light that is outside a limit of diffraction of said objective lens.

2. The optical device as claimed in claim 1, wherein said laser element is a vertical resonator.

3. The optical device as claimed in claim 1, wherein said laser element is a horizontal resonator.

4. The optical device as claimed in claim 1, wherein said photodetector is located in a region which is outside a radius of 1.22 $\lambda$/N.A. from the optical axis of light reflected from the section of said optical storage medium irradiated with the laser light derived from said laser element, where a wavelength of said plane light emitting laser element and the number of numerical aperture of said objective lens are represented by $\lambda$ and N.A., respectively.

5. The optical device as claimed in claim 1, wherein a control circuit for said laser element is integrated on said semiconductor substrate.

6. The optical device as claimed in claim 1, wherein a signal processing circuit for detection signals from said photodetector is integrated on said semiconductor substrate.

7. The optical device as claimed in claim 1, wherein said photodetector is provided with means for separating angular component of polarized light.

8. The optical device as claimed in claim 1, wherein said optical storage medium is a bar code.

9. The optical device as claimed in claim 1, wherein said optical storage medium is an optical disk.

10. A bar code reader for reading a bar code comprising:
    a semiconductor laser light source for emitting plane light;
    an objective lens for focusing said plane light on a bar code; and
    at least one photodetector,
    wherein said objective lens is positioned to receive light which is reflected and light which is scattered by said bar code, said objective lens directing said reflected light back to said light source and directing only said scattered light outside a limit of diffraction of said objective lens onto said photodetector.

11. A reader as claimed in claim 10, wherein said light source and said at least one photodetector have parallel optical axes.

12. A reader as claimed in claim 10, wherein said light source and said at least one photodetector are monolithically formed on a common semiconductor substrate.

13. A method of reading a bar code comprising:
    emitting plane light with a semiconductor laser light source;
    focusing said plane light on a bar code with an objective lens;
    receiving light which is scattered by said bar code and light which is reflected by said bar code with said objective lens;
    directing said reflected light onto said light source with said objective lens;
    directing only the scattered light outside a limit of diffraction of said objective lens onto at least one photodetector with said objective lens; and
    determining data stored on said bar code by detecting said scattered light from outside the limit of diffraction.

14. A method as claimed in claim 13, further comprising arranging said light source and said at least one photodetector to have parallel optical axes.

15. A method as claimed in claim 13, further comprising monolithically forming said light source and said at least one photodetector on a common semiconductor substrate.

* * * * *